(12) United States Patent
Satoh

(10) Patent No.: US 8,080,814 B2
(45) Date of Patent: Dec. 20, 2011

(54) METHOD FOR IMPROVING IMPLANT UNIFORMITY DURING PHOTORESIST OUTGASSING

(75) Inventor: Shu Satoh, Byfield, MA (US)

(73) Assignee: Axcelis Technologies Inc., Beverly, MA (US)

(*) Notice: Subject to any disclaimer, the term of this patent is extended or adjusted under 35 U.S.C. 154(b) by 139 days.

(21) Appl. No.: 12/717,536

(22) Filed: Mar. 4, 2010

(65) Prior Publication Data
US 2011/0215262 A1   Sep. 8, 2011

(51) Int. Cl.
*H01J 37/302* (2006.01)
*H01J 37/02* (2006.01)

(52) U.S. Cl. .......... 250/492.21; 250/492.22; 250/492.2; 427/523

(58) Field of Classification Search ............ 250/396 R, 250/397, 398, 492.1, 492.2, 492.3, 492.21, 250/492.22, 492.23; 427/523
See application file for complete search history.

(56) References Cited

U.S. PATENT DOCUMENTS

| | | | |
|---|---|---|---|
| 4,367,411 A * | 1/1983 | Hanley et al. | ............. 250/492.2 |
| 4,539,217 A | 9/1985 | Farley | |
| 4,587,433 A | 5/1986 | Farley | |
| 4,847,504 A | 7/1989 | Aitken | |
| 4,851,693 A * | 7/1989 | Fisher | ............. 250/492.3 |
| 5,834,786 A | 11/1998 | White et al. | |
| 6,323,497 B1 | 11/2001 | Walther | |
| 7,589,333 B2 | 9/2009 | Graf et al. | |
| 2004/0047561 A1 * | 3/2004 | Tuda | ............. 385/39 |
| 2004/0149983 A1 * | 8/2004 | Lee et al. | ............. 257/31 |
| 2006/0057303 A1 | 3/2006 | Agarwal et al. | |
| 2009/0218315 A1 * | 9/2009 | Shannon | ............. 216/64 |
| 2009/0272918 A1 * | 11/2009 | Satoh | ............. 250/492.21 |

OTHER PUBLICATIONS

Office Action dated Mar. 3, 2011 in connection with U.S. Appl. No. 12/431,081.
Notice of Allowance dated Aug. 29, 2011 issued to U.S. Appl. No. 12/431,081, p. 1-19.

* cited by examiner

*Primary Examiner* — Bernard E Souw
(74) *Attorney, Agent, or Firm* — Eschweiler & Associates, LLC

(57) ABSTRACT

A method and apparatus is provided for improving implant uniformity of an ion beam experiencing pressure increase along the beam line. The method comprises generating a main scan waveform that moves an ion beam at a substantially constant velocity across a workpiece. A compensation waveform (e.g., quadratic waveform), having a fixed height and waveform, is also generated and mixed with the main scan waveform (e.g., through a variable mixer) to form a beam scanning waveform. The mixture ratio may be adjusted by an instantaneous vacuum pressure signal, which can be performed at much higher speed and ease than continuously modifying scan waveform. The mixture provides a beam scanning waveform comprising a non-constant slope that changes an ion beam's velocity as it moves across a workpiece. Therefore, the resultant beam scanning waveform, with a non-constant slope, is able to account for pressure non-uniformities in dose along the fast scan direction.

20 Claims, 10 Drawing Sheets

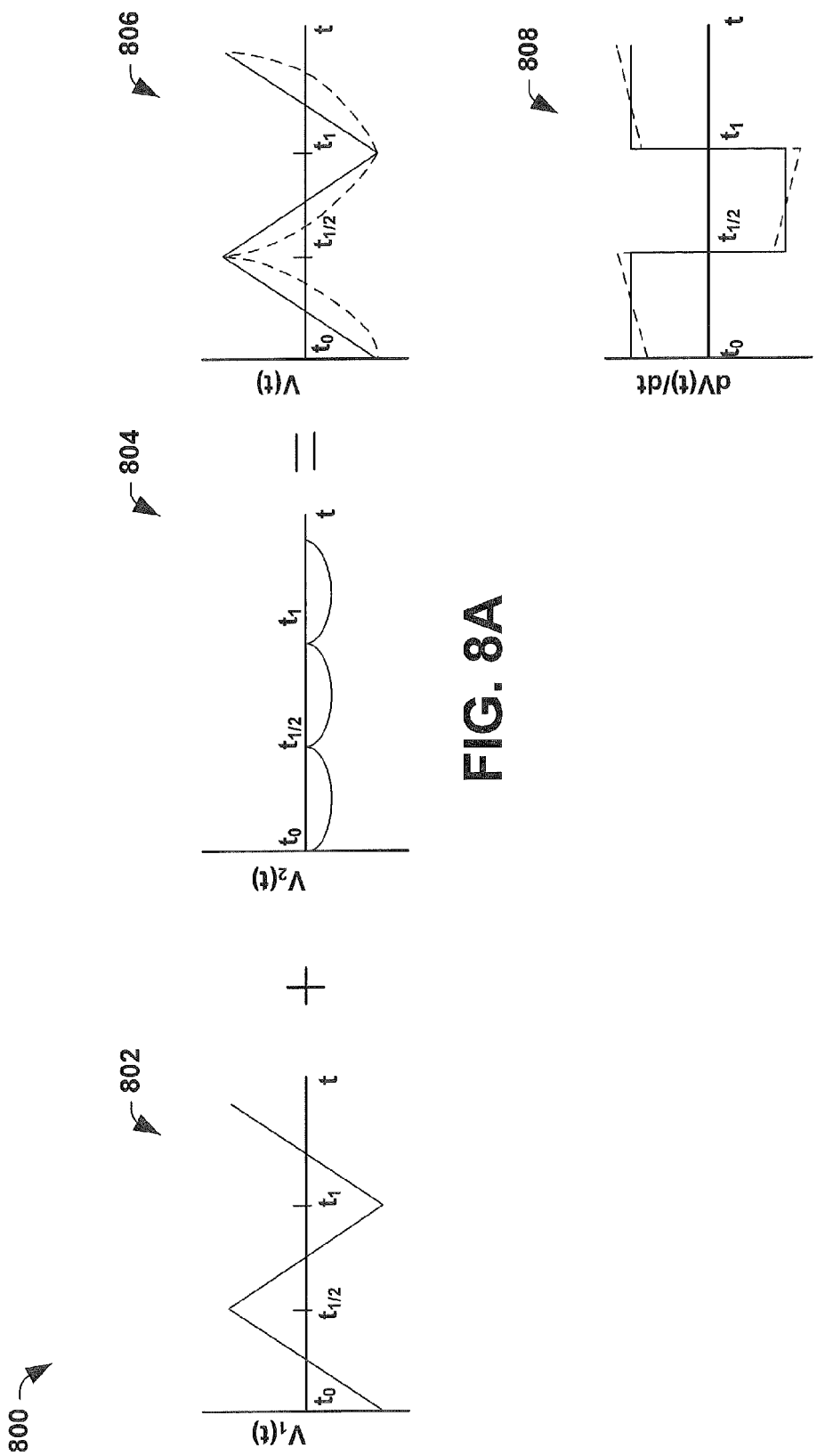

METHOD FOR IMPROVING IMPLANT UNIFORMITY DURING PHOTORESIST OUTGASSING

FIELD OF THE INVENTION

The present invention relates generally to ion implantation systems, and more specifically to a method and apparatus for improving implant uniformity of an ion implantation system during photoresist outgassing.

BACKGROUND OF THE INVENTION

In the manufacture of semiconductor devices, ion implantation is often used to dope semiconductor workpieces (e.g., silicon wafers) with impurities. For example, ion implanters or ion implantation systems may treat a workpiece with an ion beam, to produce n-type or p-type doped regions or to form passivation layers on the workpiece. When used for doping semiconductors, the ion implantation system injects a selected ion species to produce the desired extrinsic material.

Typically, ion beam implanters comprise an ion source configured to generate positively charged ions from ionizable source material. An ion beam is formed from the generated ions and is directed along a beam path to an ion implantation station. The ion implanter may comprise beam forming and shaping structures (e.g., beam corrector magnets) extending between the ion source and the implantation station. The beam forming and shaping structures maintain the integrity of the ion beam en route to the implantation station.

Since the size of a workpiece is often greater than the size of an ion beam, hybrid scan ion implanters are often employed to enable an ion beam to scan over a surface of a workpiece. In general, a scanning system may comprise a pair of scan plates (or a scanning electromagnet for electromagnetic scanning) positioned to deflect an ion beam and a scan waveform generator configured to apply voltages, associated with a scan waveform, to the scan plates (or to apply currents to the scanning electromagnet for electromagnetic scanning). The voltages produce a time varying electric or magnetic field between the plates to deflect or scan a beam (e.g., a pencil beam) back and forth over a scan path (e.g., into a ribbon beam), thereby effectively spreading out a beam, while moving a workpiece in an orthogonal direction.

Often, it is desirable to provide uniform implantation over the surface of a workpiece. Unfortunately, in practical application an ion implantation system is often subject to non-uniformities over a wafer. If these non-uniformities are not corrected the workpiece may be implanted non-uniformly and product yield may suffer.

SUMMARY OF THE INVENTION

The present invention is directed towards a method and apparatus for improving implant uniformity of an ion implantation system experiencing vacuum pressure variations (e.g., due to photoresist outgassing) during a course of an implant. Although, there have been several prior arts to improve implant uniformity for systems undergoing photoresist outgassing in the slow mechanical motion direction, there has been no successful methods in correcting implant non-uniformity in the ion beam scan direction (i.e., fast scan direction) during photoresist outgassing. The present invention overcomes difficulties in correction in the beam scan direction (e.g., such as modifying the fast scan waveform, usually 1 KHz repetition), according to rapidly changing photoresist outgassing condition.

In general, the method comprises generating a main scan waveform (e.g., triangle waveform) that moves an ion beam at a substantially constant velocity. A compensation waveform (e.g., quadratic waveform), having a fixed height and waveform (i.e., shape), is also generated and added to the main scan waveform to form a beam scanning waveform that is provided to an ion beam scanning apparatus. By adjusting a mixture ratio between the main scan waveform and the compensation waveform, according to the changing pressure caused by photoresist outgassing conditions, a beam scanning waveform having a non-constant slope configured to change the velocity of the ion beam as it moves across a wafer can be provided. Modifying the mixture ratio of the main scan waveform and the compensation waveform can be achieved very fast and smoothly to follow the rapidly changing conditions.

More specifically, on many serial ion implanter architectures, the non-uniformity caused by photoresist outgassing along the ion beam scan direction (i.e., fast scan direction) tends to be a linear variation of dose. Since an instantaneous dose, at a point on a workpiece, is proportional to beam current and writing speed of beam at the point, correction of the linear dose variation can be achieved by a linear variation of ion beam writing speed in beam scan direction (i.e., fast scan direction). In terms of the beam scanning waveform, a quadratic variation of the main scan waveform can provide a correction of the linear dose variation since writing speed is a time derivative of beam position in time.

Accordingly, in one particular embodiment, a mixture ratio of a compensation waveform having a quadratic waveform to a main scan waveform having a substantially constant slope (e.g., having a substantially piecewise constant slope with various subsets of the main scan waveform's range have different constant slopes) may be adjusted according to an outgassing condition (e.g., by substantially instantaneous vacuum reading from a vacuum gauge). In one example, a main scan waveform is modified by a quadratic compensation waveform to form a beam scanning waveform that causes large writing speed variation along the beam scan direction when the pressure is large and almost a constant velocity when the pressure is small (i.e., zero mixture of quadratic component to almost pure triangle waveform). Therefore, the resultant beam scanning waveform, with a non-constant slope, is able to account for non-uniformities in dose along the fast scan direction due to changes in pressure.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8A illustrates the summation of the main scan waveform with the quadratic compensation waveform;

FIG. 8B is a voltage versus time graph illustrating the derivative of the summation of the main scan waveform and quadratic waveform.

DETAILED DESCRIPTION OF THE INVENTION

Figure 1:
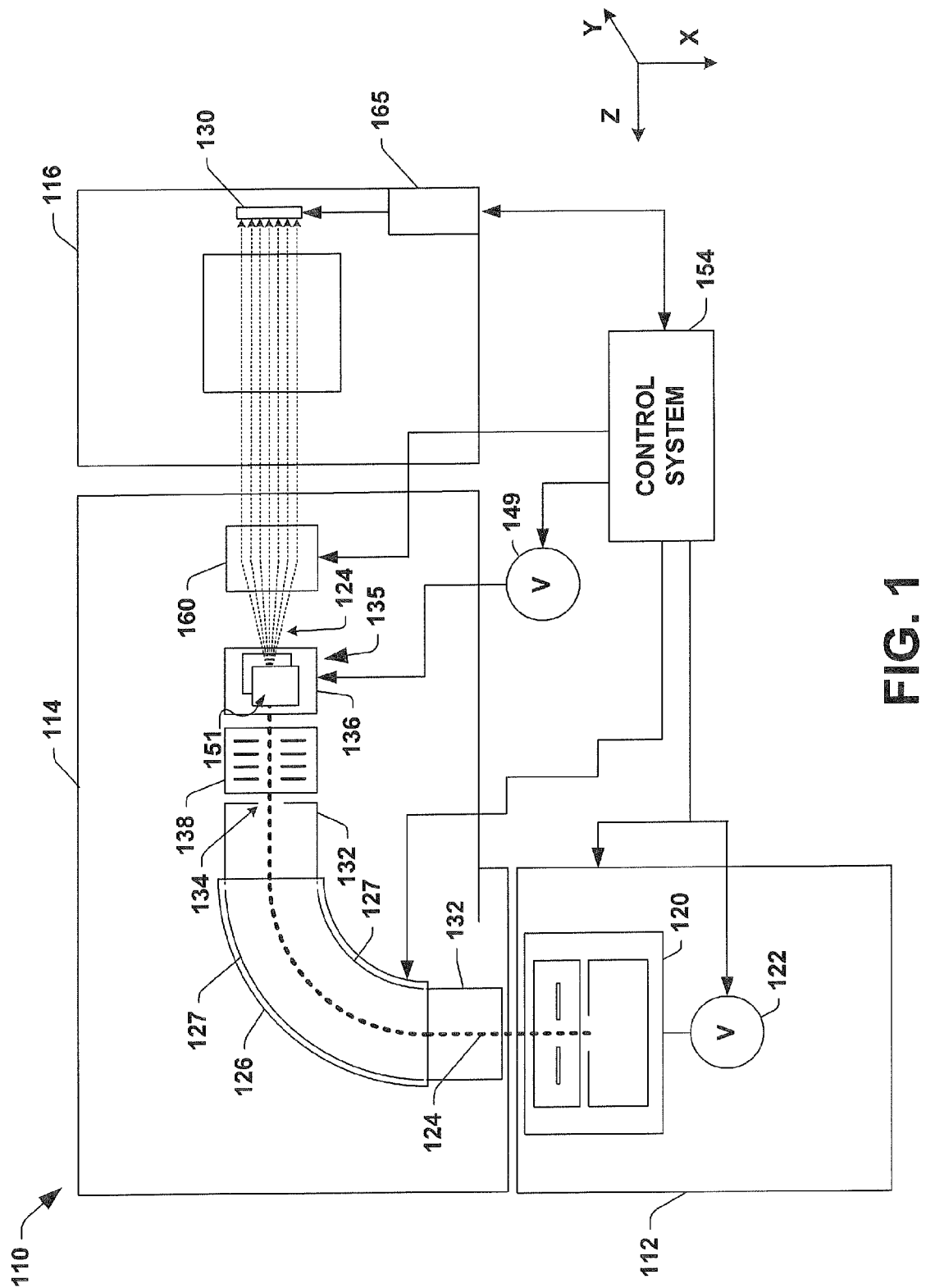
FIG. 1 is schematic a block diagram illustrating an exemplary ion implanter.

The present invention will now be described with reference to the drawings wherein like reference numerals are used to refer to like elements throughout.

FIG. 1 illustrates an exemplary ion implantation system 110 in accordance with an aspect of the present invention. The system 110 is presented for illustrative purposes and it is appreciated that aspects of the invention are not limited to the described ion implantation system and that other suitable ion implantation systems can also be employed.

The system 110 has a terminal 112, a beamline assembly 114, and an end station 116. The terminal 112 includes an ion source 120 powered by a high voltage power supply 122 that produces and directs an ion beam 124 to the beamline assembly 114. The beamline assembly 114 comprises a mass analyzer 126. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions having inappropriate mass-energy products are rejected (e.g., ions having too great or too small a mass-energy product are deflected into side walls 127 of the beamguide 132). In this manner, the mass analyzer 126 allows those ions in the beam 124 which have the desired mass-energy product to pass there-through and exit through a resolving aperture 134. After the mass selection, energy of the selected ions is adjusted by further acceleration (or deceleration) in accelerator (or decelerator) section 138. Since ion beam collisions with other particles can degrade beam integrity, one or more pumps (not shown) may be included to evacuate, at least, the beamguide 132 and the end station 116.

A scanning system 135 is illustrated in system 110, comprise of two opposing electrostatic scanner electrodes, 151. A control system 154 is coupled to scanner power supply 149 which is operatively configured to provide a voltage waveform (also known as a scanning waveform) applied by power supply 149, to the scanner electrodes 151. The scanning waveform forms a time varying electrostatic field that scans the beam 124 back and forth (e.g., into a ribbon beam), in this example. Angle corrector magnet 160 changes the fanning out ion beam out of the scanner 136 into a parallel shifting ion beam going into the end station 116, In a hybrid scan implanter, the workpiece 130 is mechanically moved up and down (in and out of paper) with the help of electrical motion control system 165. The end station 116 receives the ion beam 124 which is directed toward a workpiece 130 (e.g., wafer). It will be appreciated that different types of end stations 116 may be employed in the implanter 110.

Figure 3A:
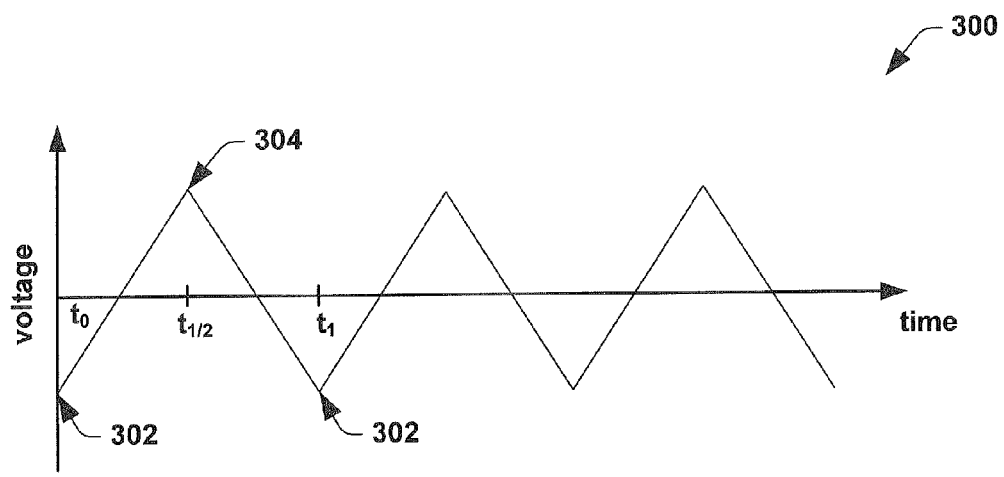
FIG. 3A is an exemplary main scan waveform.

FIG. 3A illustrates an exemplary scanning waveform (e.g., to be used for beam scan along a fast scan direction/x-axis) comprising a triangular waveform. Respective 'pieces' of the waveform have a substantially constant slope (e.g., +m, −m) that is configured to cause the ion beam to scan along the surface of a workpiece at a substantially constant velocity. For example, as the waveform goes up from $t_0$ to $t_{1/2}$ the ion beam will scan the wafer from left edge 302 of a workpiece to an opposite right edge 304 of the workpiece at a substantially constant velocity. Similarly, as the waveform goes up from $t_{1/2}$ to $t_1$ the ion beam will scan the workpiece from right to left at a substantially constant velocity.

Figure 2A:
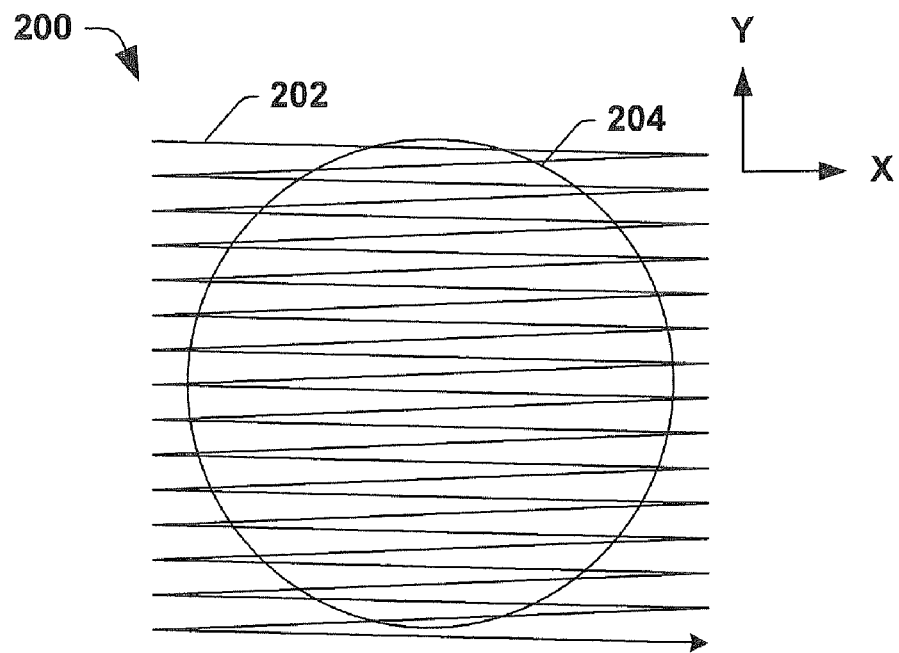
FIG. 2A illustrates an exemplary scan path of an ion beam across a workpiece.
Figure 2B:
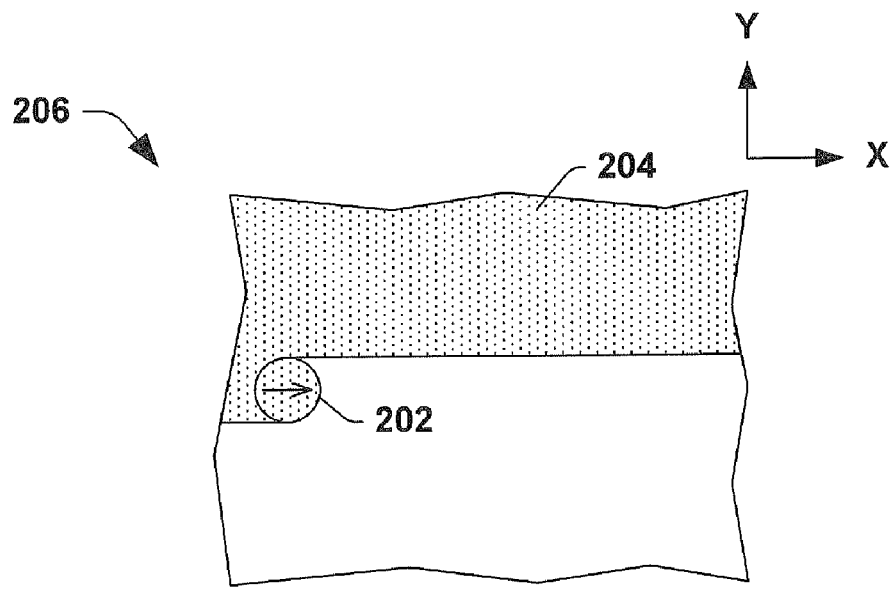
FIG. 2B illustrates a close up of a section of the workpiece, wherein the ion beam scans over a path of the workpiece.

FIG. 2A illustrates a scan path of a hybrid ion beam 202 across a workpiece 204, whereby the ion beam 202 is imparted on the entire exposed surface of the workpiece 204. In the illustrated scan path of the hybrid system the workpiece may be mechanically translated in a first Y (slow scan) direction while the ion beam is scanned in a second X (fast scan) direction to impart the beam over the entire workpiece. Therefore, through a plurality of left to right ion beam scans, the entire surface of the workpiece is implanted. FIG. 2B illustrates a close up 206 of a section of the workpiece 204, wherein the ion beam 202 scans over a path along the workpiece.

As a workpiece 204 starts moving in the first (Y or slow scan) direction, it enters into the ribbon of the ion beam 202 and the ion beam comes into contact with photoresist coving the workpiece 204. When photoresist is struck by the ion beam 202, part of the photoresist layer begins to break down under the ion beam irradiation and starts to emit an outgas which causes a rise in the pressure of the end station. The outgassing will peak when the ion beam 202 is at the center of the workpiece 204, and as the workpiece 204 subsequently moves out of the ion beam 202 the outgassing is reduced and the vacuum level improves.

On a normal implant process, a workpiece, such as a semiconductor wafer, moves in and out of beam several times to ensure implant uniformity along the mechanical motion direction. Photoresist outgassing increases as the beam contacts a larger area of the workpiece surface until, when the wafer is over half way through the beam, the outgassing decreases as the wafer contacts a smaller area of the workpiece. This periodic scan motion results in a periodic variation of vacuum pressure level.

Figure 3B:
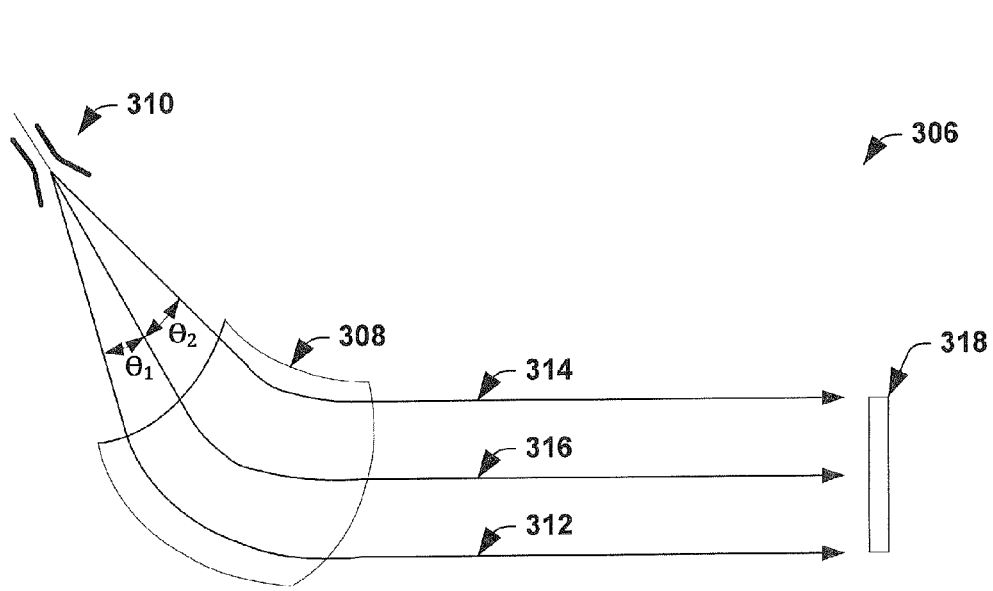
FIG. 3B is a schematic diagram of a beam line that illustrates the path length difference between different parts of the ion beam.

The effect of such pressure changes causing implant dose non-uniformity along the slow mechanical scan direction is well known in the art. However, the inventor has appreciated that these pressure changes (e.g., due to photoresist outgassing) also cause dose non-uniformities in the fast scan direction. In particular, the path differences between different parts of the ion beam cause different ion doses to reach the workpiece 130. For example, as illustrated in FIG. 3B, a typical angle corrector magnet 308 arrangement used to convert a fanning out beam 310 to a parallel beam (comprising 312, 314, and 316), creates a situation wherein the beam path length from scanner to workpiece 318 depends on the final beam position on workpiece. For example, in FIG. 3B, the outside edge of an ion beam 312 has a longer path length to reach the workpiece 318 than the inside edge of the ion beam 314. Under good vacuum conditions, such a path length difference does not cause a difference in dose at the workpiece 318. However, under poor vacuum conditions, charge exchange collisions with background gas can result in a difference dose due to a varying path length (e.g., the longer path length of 312 will undergo more charge exchange collisions than the shorter path length of 314).

Figure 3C:
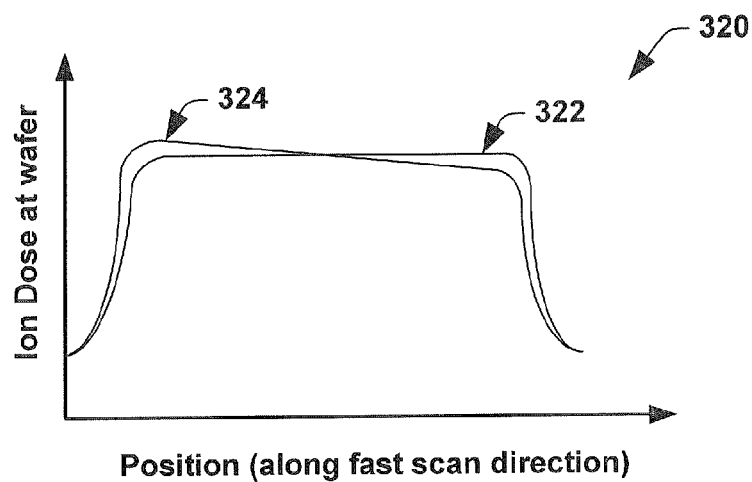
FIG. 3C is a graph of ion dose versus position illustrating the non-uniformity of dose along the fast scan direction.

Such dose non-uniformities change the dose profile of a workpiece along the fast scan direction. FIG. 3C illustrates a graph 320 of dose (y-axis) versus position along the fast scan direction (x-axis). As illustrated in FIG. 3C, pressure changes (e.g., due to photoresist outgassing) cause the dose profile to change from a relatively uniform profile 322 over the fast scan direction (e.g., in good vacuum pressure conditions) to a dose profile 324 along the fast scan direction having a predominately linear slope decreasing from left to right (e.g., in poor vacuum pressure conditions).

Figure 3D:
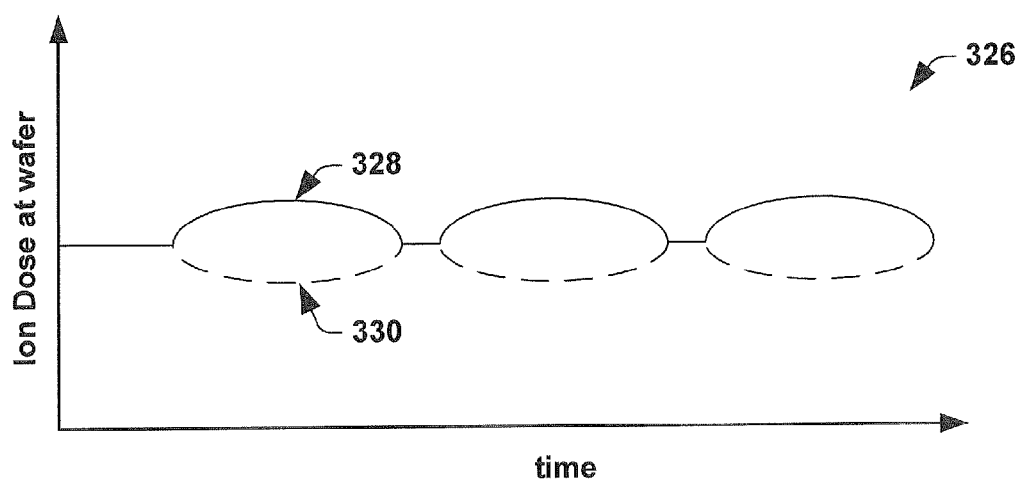
FIG. 3D is a graph of ion dose versus time illustrating the periodic non-uniformity of dose along the fast scan direction for multiple wafers.

The inventor has further appreciated that compensation in the slow mechanical scan velocity merely provides compensation, in average dose per fast scan, to correct one part of the ion beam, such as the center of the ion beam 316. This results in a beam current 326 as illustrated in FIG. 3D, wherein one edge of the ion beam 328 provides an overdose and the other edge of the ion beam 330 provides an under dose. Furthermore, due to the speed of changes in vacuum pressure during an implant, continuous changes to the main scan waveform according to varying vacuum condition are technically difficult to implement because of inherent delays due to computational limitations.

Accordingly, the inventor has provided a method and apparatus for improving implant uniformity in a fast scan direction during photoresist outgassing. The method comprises generating a main scan waveform having a substantially constant slope that moves an ion beam over a workpiece at a substantially constant velocity. A compensation waveform (e.g., quadratic waveform for a linear dose variation from left to right), having a fixed height and waveform, is also generated and added (e.g., through a variable mixer) to the main scan waveform to form a beam scanning waveform that is provided to a scanning apparatus. The ratio of the mixture between the main scan waveform and the compensation waveform may be adjusted in response to a substantially instantaneous vacuum pressure signal. The adjustment can be performed at much higher speed and with greater ease than continuously modifying a main scan waveform. The addition of the compensation (e.g., quadratic) waveform to the main scan waveform provides a beam scanning waveform that comprises a non-constant slope that changes the velocity of the ion beam as it moves across a wafer.

In one particular embodiment, a quadratic compensation waveform is added to a main scan waveform having a substantially constant slope to produce a beam scanning waveform (i.e., the addition changes a mixture ratio between a compensation waveform having a quadratic waveform and a main scan waveform having a substantially constant slope) that accounts for changes in pressure. Specifically, the beam scanning waveform is modified by mixing a main scan waveform with a varying amount of the quadratic compensation waveform, according to a measured pressure condition, to create increased scan velocity variation from left to right when the pressure is large (e.g., to move the ion beam from a lower velocity to a higher velocity from left to right) and decreased velocity variation (i.e. constant scan velocity) when the pressure is small. Therefore, the resultant beam scanning waveform, with a non-constant slope, is able to account for non-uniformities in dose along the fast scan direction due to changes in pressure.

Figure 4:
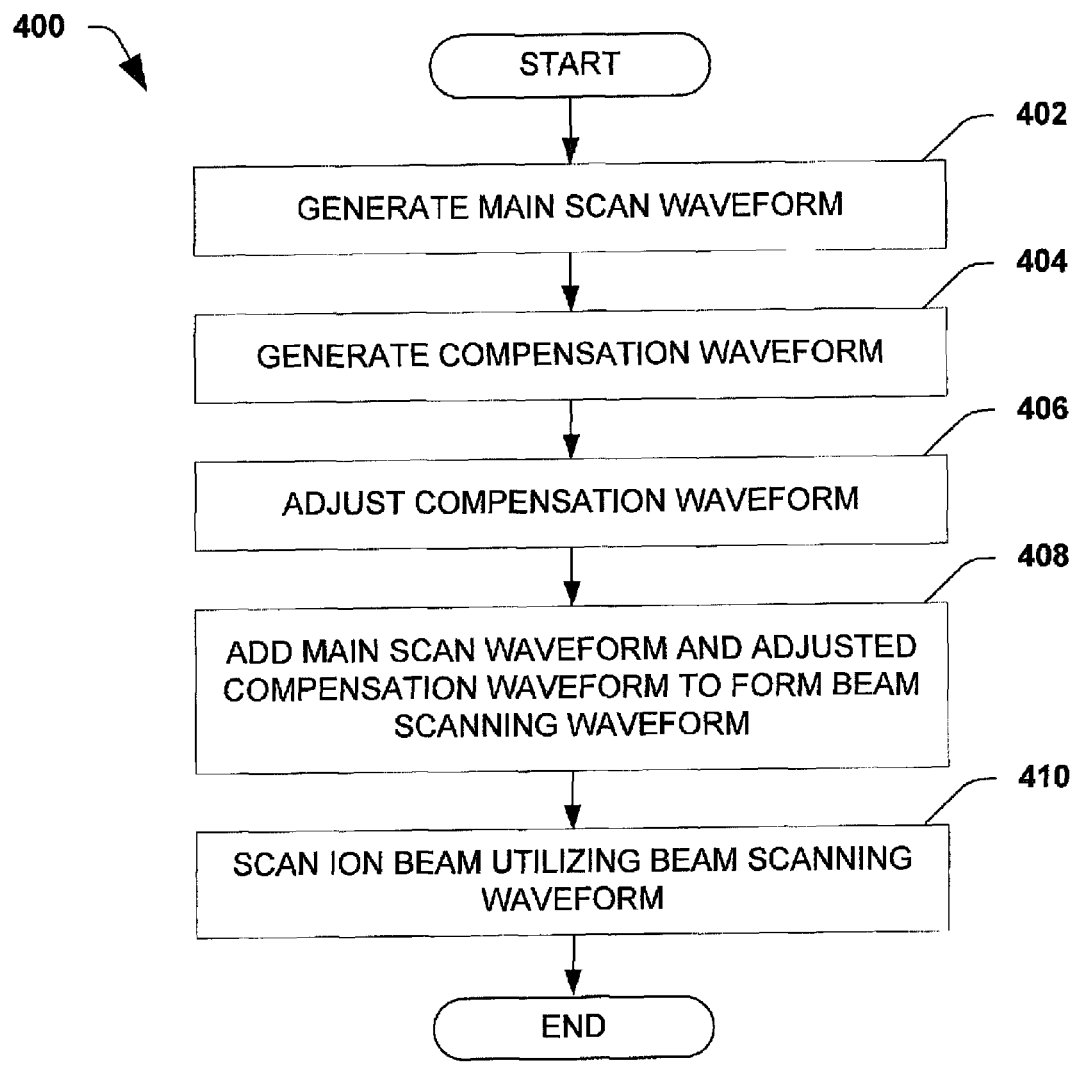
FIG. 4 is one embodiment of a method for improving implant uniformity during photoresist outgassing.

FIG. 4 illustrates an exemplary method 400 for improving implant uniformity in the fast scan direction in response to changes in pressure (e.g., due to photoresist outgassing). The method alters the substantially linear slope of a main scan waveform by adding, or mixing, a compensation waveform (e.g., a quadratic waveform) with the main scan waveform, thereby resulting in a beam scanning waveform (having a non-linear slop) that comprises a variable mixture ratio between the main scan waveform and the compensation waveform.

While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 402 a main scan waveform is generated. The main scan waveform is a waveform comprising voltages or currents that are applied to a scanning apparatus (e.g., scanning plates) to control the motion (e.g., instantaneous position) of an ion beam as it is scanned over a workpiece. In one embodiment, the main scan waveform may comprise a piecewise linear function (e.g., a function having various pieces or sub-ranges of a main scan waveform's range having different constant slopes) such as a triangular waveform, wherein all pieces of the function comprise a slope having an equal magnitude (e.g., +m, −m). Such a main scan waveform with a constant slope is configured to produce an ion beam that travels across a workpiece at a substantially uniform speed, thereby resulting in a substantially uniform implant dose over the entire workpiece. In one embodiment, the main scan waveform may comprise a slight compensation to make the implant uniformity in beam scan direction uniform (i.e., fast scan direction), but in general the main scan waveform will not change its amplitude or waveform throughout an implantation due to variations in vacuum conditions.

At 404 a compensation waveform is generated. The compensation waveform may comprise a waveform having a shape (e.g., polynomial shape) which will allow it to compensate for the detrimental effects of pressure changes along the beam line (e.g., along the scan path of the ion beam at the end station, due to photoresist outgassing). In one embodiment, the compensation waveform may comprise a quadratic waveform (e.g., a waveform having the shape of $ax^2+bx+c$) having a fixed height and waveform. The quadratic compensation waveform may be configured to periodically repeat the quadratic waveform every time that an ion beam scans across the wafer and thereby accounts for periodic changes in pressure due to photoresist outgassing (e.g., periodic changes in pressure, as shown in FIG. 3A). In an alternative embodiment, the compensation waveform may comprise a higher order polynomial function (e.g., quartic, quintic, sextic, etc.) that is configured to provide correction to the main scan waveform. Such higher level polynomial functions may allow for more exact correction of pressure non-uniformities measured along the beam line.

The compensation waveform may be generated by various means. In one embodiment, the compensation waveform may be generated by a different wave generator than the main scan waveform. In an alternative embodiment, one or more computers may be configured to generate both the main scan waveform and the compensation waveform, wherein the one or more computers mix the main scan waveform and the compensation waveform according to a software routine (e.g., a software routine stored on a computer readable medium).

At 406, the amplitude of the compensation waveform is adjusted. In one embodiment, the amplitude of the compensation waveform may be adjusted to a larger or a smaller amplitude in response to a substantially instantaneous vacuum pressure measurement (e.g., a pressure measurement corresponding to the level of outgassing present in the process chamber). In one embodiment, the amplitude of the compensation waveform may be adjusted proportional to the amplitude of the main scan waveform so that a maximum mixture ratio of the compensation waveform stays constant irrespective of the amplitude of the main scan waveform (e.g., the amplitude of the main scan waveform may be adjusted for different ion energy and charge state value to obtain a constant scan width). In one embodiment, wherein the slope of the non-uniformity along the fast beam scan is opposite (i.e., higher dose on a longer path length), the polarity of the compensation waveform may be reversed.

At 408 the main scan waveform and the adjusted compensation waveform are added together (i.e., mixed together) to form a beam scanning waveform. The addition of the main scan waveform with the variable compensation waveform allow for a mixture ratio between the waveforms to be adjusted, resulting in a easily controllable beam scanning waveform. In one embodiment, the summation of the compensation waveform and the main scan waveform result in a beam scanning waveform that comprises a linear slope correction to main scan waveform. In other words, the quadratic compensation waveform may decrease the slope of the waveform for one part of the wafer (e.g., causing the ion beam to slow down during that part of the scan) and increase the slope of the waveform for another part of the wafer (e.g., causing the ion beam to speed up during that part of the scan). Accordingly, the linear slope correction provided by the compensation waveform accounts for the linear non-uniformity of dose along the fast scan direction.

In one example, the compensation waveform is configured to cause large writing speed variation along the beam scan direction when a large pressure is measured (i.e., when the amount of photoresist outgassing is large). Alternatively, the compensation waveform may be configured to provide an almost a constant velocity when a small pressure is measured (e.g., a zero mixture of quadratic component to almost pure triangle waveform). In one embodiment, the ratio of the mix may be adjusted by an instantaneous vacuum pressure signal, which can be performed at much higher speed and ease than continuously modifying scan waveform.

Adjusting the mixture ratio between the compensation wave and the main scan waveform causes the slope of the resulting beam scanning waveform to be non-linear, resulting in an ion beam that proceeds across a workpiece at a non-constant velocity. For example, a compensation waveform may be configured to cause an ion beam to move across a wafer (e.g., from right to left) in a motion that begins slowly and then gradually speeds up thereby allowing the ion beam to compensate for pressure changes by providing less dose at one side and excess dose at the other side of a scan. Accordingly, the compensation waveform introduces a compensation to the main scan waveform that allows it to account for the changes in pressure.

At 410 the beam scanning waveform is provided to a beam scanning apparatus. In one embodiment, the scanning apparatus may utilize the beam scanning waveform to apply voltages to two or more scanning plates positioned to deflect the ion beam using an electric field.

Actions 402-410 may be iteratively performed in a manner which tunes the beam current based upon the outgassing pressure. For example, it will be appreciated in method 400 the compensation waveform may be dynamically adjusted during operation of the ion implantation beam. Dynamic adjustment of the compensation waveform allows the scanning system to account for changes to the photoresist outgassing as they occur, thereby allowing the scanning system to maintain a constant ion beam current over a surface of an entire workpiece. For example, if a change in pressure is not detected, the amplitude of the compensation waveform is maintained. However, it a change in pressure is detected, the amplitude of the compensation waveform may be increased or decrease, thereby adjusting the mixture ratio and changing the beam scanning properties (e.g., velocity) and to account for the change in pressure. Therefore, by dynamically adjusting the amplitude of the compensation waveform, the scan waveform can be modified to account for dynamic changes in pressure without changing the scan waveform.

Figure 5:
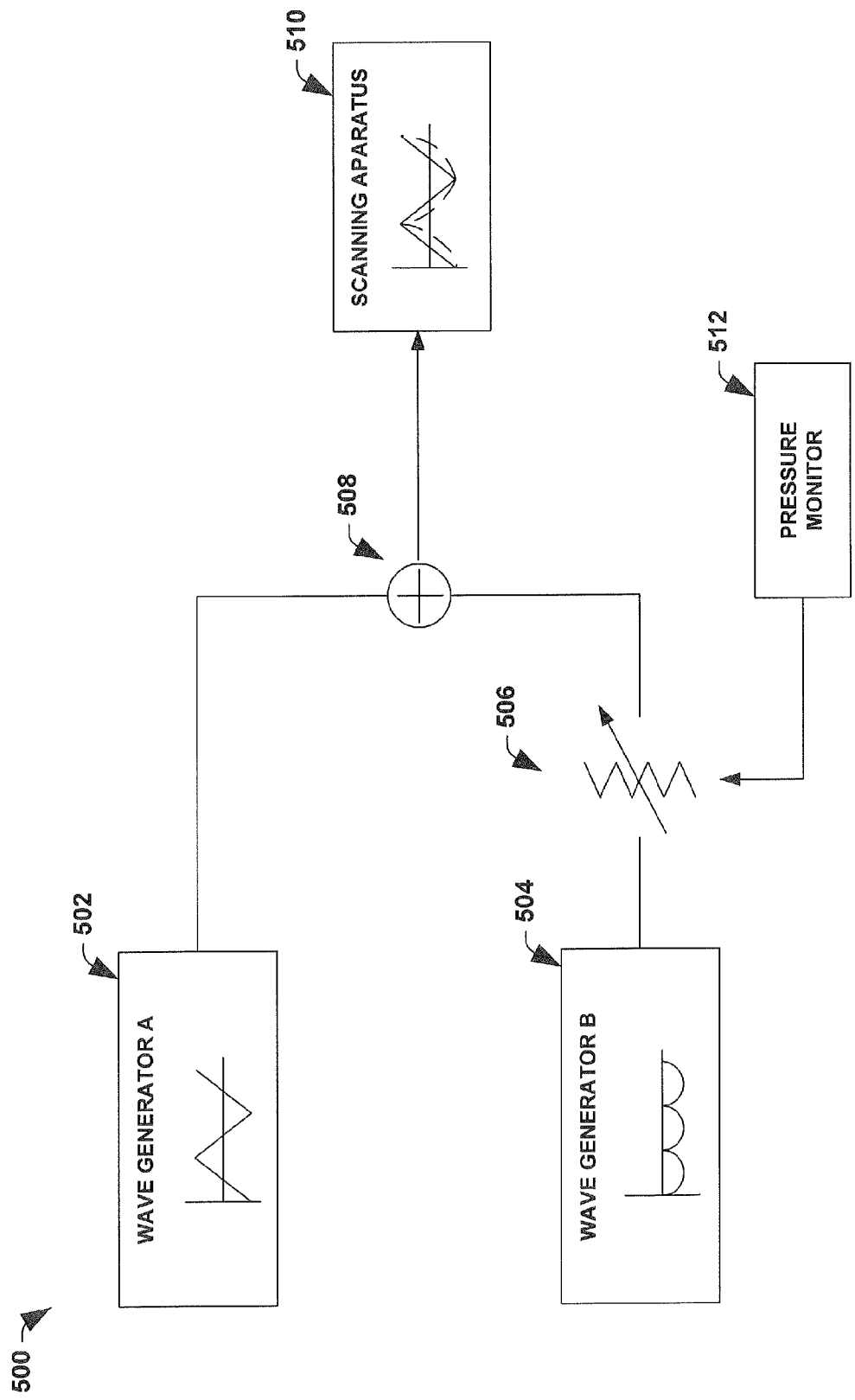
FIG. 5 is one embodiment of scanning system configured to improving implant uniformity during photoresist outgassing.

FIG. 5 illustrates an embodiment of a scanning system, as provided herein. As illustrated in FIG. 5, the scanning system 500 may comprise a first wave generator 502 and a second wave generator 504. An adder 508 is configured to add the output of the first and second wave generators to produce a beam scanning waveform that is output a scanning apparatus 510.

The first wave generator 502 is configured to generate a main scan waveform. The main scan waveform may comprise a piecewise linear function such as a triangular waveform, wherein all pieces of the function comprise a slope having an equal magnitude (e.g., +m, −m). In one embodiment, the main scan waveform may comprise a necessary correction to account for local uniformity irregularities in the slow scan direction.

A second wave generator 504 is configured to generate a compensation waveform. In one embodiment, the compensation waveform comprises a quadratic waveform having a fixed height. The quadratic compensation waveform may be configured to periodically repeat a quadratic waveform twice within a time that is substantially equal to the period of the scan waveform. For example, a triangular waveform will have a period that allows an ion beam to traverse the workpiece twice (once left to right, once right to left). The quadratic compensation waveform may be repeated twice within that period thereby allowing it to compensate for a scan waveform driving the ion beam in each direction.

In one embodiment, an amplitude adjustment apparatus 506 is coupled to the second wave generator 504. An amplitude adjustment circuit is configured to increase the compensation (e.g., quadratic) waveform by a mixture ratio, k. The mixture ratio of the compensation waveform, k, may be varied before mixing the scan waveform with the compensation waveform. The beam scanning waveform, output to the scanning apparatus, is therefore equal to $Vs_0(t)+k*Vc_1(t)$, wherein $Vs_0$ is the scan waveform and $Vc_1$ is the compensation waveform. In one embodiment, the mixture ratio, k may vary between −1 and 1, mostly very close to around 0 and typically between −0.01 and 0.01 for 1% compensation. Since k changes in real time, the sign of k may be predetermined by energy and species of ions (since at high energy the sign of k may flip and the magnitude of k is obtained in real time).

As illustrated in FIG. 5, the amplitude adjustment apparatus 506 may comprise a variable compensation attenuator coupled to a pressure monitor, in one embodiment. The variable compensation attenuator may be configured to act upon the compensation waveform prior to being summed with the scan waveform.

Figure 6A:
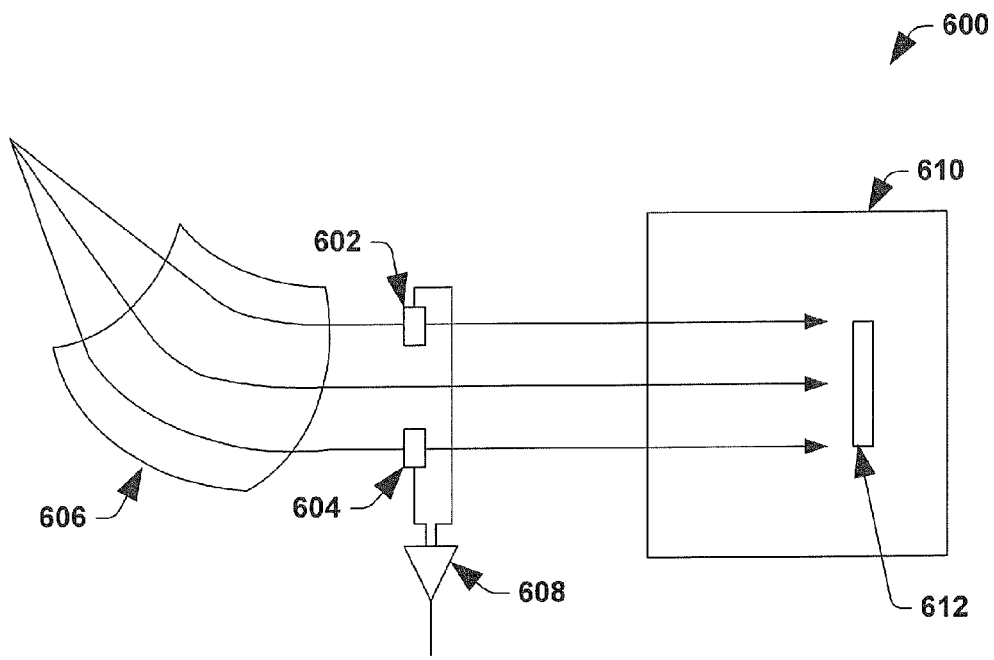
FIG. 6A illustrates one embodiment of an amplitude adjustment apparatus as provided in FIG. 5.

In an alternative embodiment shown in FIG. 6A, the amplitude adjustment apparatus may determine the mixture ratio k by utilizing a first edge faraday cup 602 and a second edge faraday cup 604 to measure the beam current at both ends of a scanned beam width. As illustrated in FIG. 6A, the edge faraday cups, 602 and 604, may be placed at the immediate exit of the angle corrector magnet 606. In one embodiment, the beam current of the two cups can be added together (e.g., at 608) to be used for slow mechanical scan velocity (orthogonal to beam scan direction), whereas the difference between the two cups is used to derive the value of the mixture ratio k.

Figure 6B:
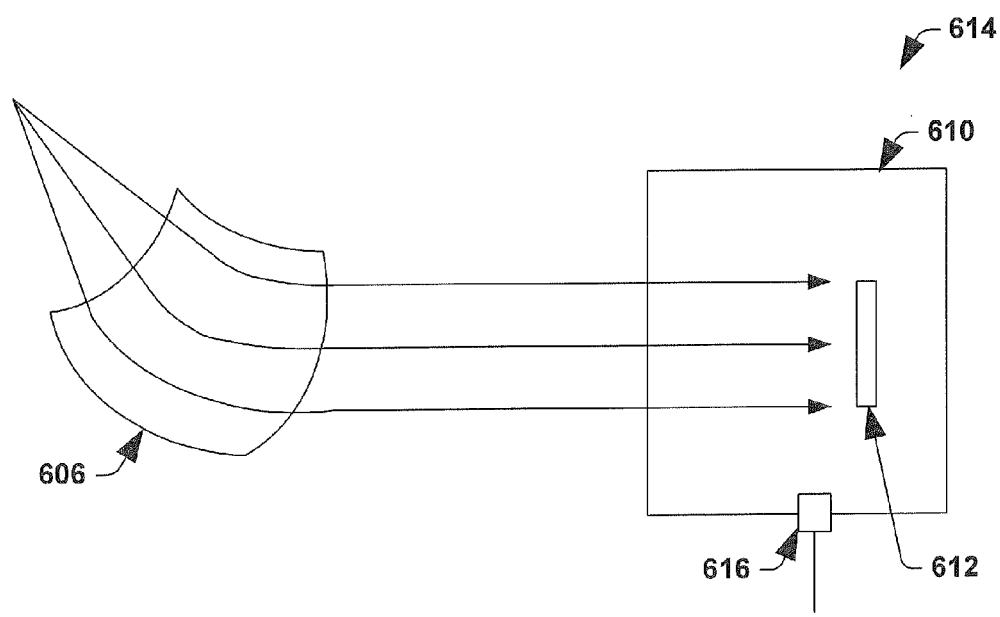
FIG. 6B illustrates an alternative embodiment of an amplitude adjustment apparatus as provided in FIG. 5.

In yet another alternative embodiment, shown in FIG. 6B, the amplitude adjustment apparatus may determine the mixture ratio k by measuring a pressure along the beam line using a pressure sensor 616 and using the measured pressure to derive the value of mixture ratio k. As shown in FIG. 6B, the pressure sensor 616 is located at the end station 610, however it will be appreciated that the pressure sensor may be placed in various locations along the beam line.

The mixture ratio between the main scan signal and the compensation signal may be adjusted in real time, thereby allowing continuous changes to a beam scanning waveform according to varying vacuum condition. For example, when there is no outgassing, the amplitude adjustment apparatus may reduce the amplitude of the compensation waveform to zero thereby causing the compensation waveform to not provide compensation to the scan waveform. Alternatively, as outgassing increases, the amplitude adjustment apparatus may increase the amplitude of the compensation waveform thereby causing the compensation waveform to provide increased compensation to the scan waveform.

FIGS. 7A-8B illustrate a particular example of the present invention provided herein. More particularly, FIGS. 7A-8B show main scan waveforms, compensation waveforms, and beam scanning waveforms as provided by a method and apparatus as provided herein.

Figure 7A:
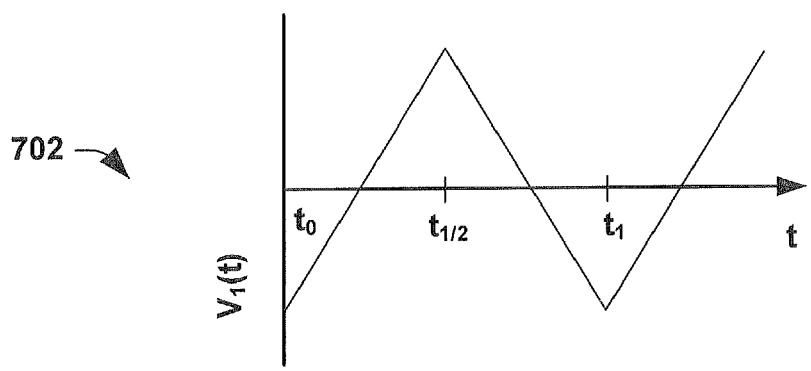
FIG. 7A is a voltage versus time graph illustrating an exemplary main scan waveform generated by a first wave generator to deflect the ion beam along the fast direction of the beam path illustrated in FIG. 6A.

FIG. 7A is a voltage versus time graph 702 illustrating an exemplary main scan waveform comprising a triangular piecewise function generated (e.g., by the first wave generator of FIG. 4) to steer an ion beam back and forth along a fast scan direction. From time $t_0$ to time $t_{1/2}$ the main scan waveform has a positive slope driving the ion beam in a first direction (e.g., left to right). From time $t_{1/2}$ to $t_1$ the main scan waveform has a negative slope driving the ion beam in a second direction (e.g., from right to left), opposite the first direction.

Figure 7B:
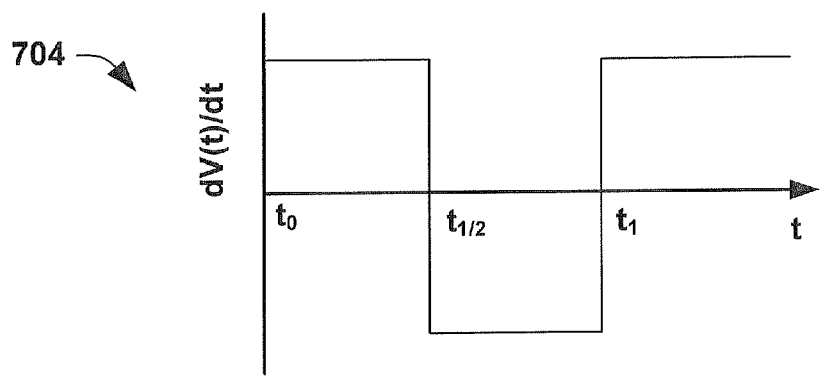
FIG. 7B illustrates the derivative of a main scan waveform generated in FIG. 7A.

FIG. 7B is a dV/dt versus time graph 704 illustrating the derivative of the main scan waveform shown in FIG. 7A. FIG. 7B illustrates that the slope of the voltage varies between a predominately linear constant positive slope and a predominately linear constant negative slope. It will be appreciated that the value of the slope shown in the dV/dt graph is representative of the velocity at which an ion beam is scanned across a workpiece. For example a constant slope over a time period means that an ion beam is moving at a constant velocity during that time period. Therefore, a main scan waveform having a constant slope, as illustrated in FIG. 7B, is designed to provide an even scan rate over a workpiece surface. For example, the main scan waveform has a constant positive slope from time $t_0$ to $t_{1/2}$ resulting in a constant rate of change in electric field directing the ion beam from the left to the right of the workpiece. From time $t_{1/2}$ to $t_1$, the main scan waveform has a constant negative slope resulting in a constant rate of change in electric field directing the ion beam from the right to the left of the workpiece.

Figure 7C:
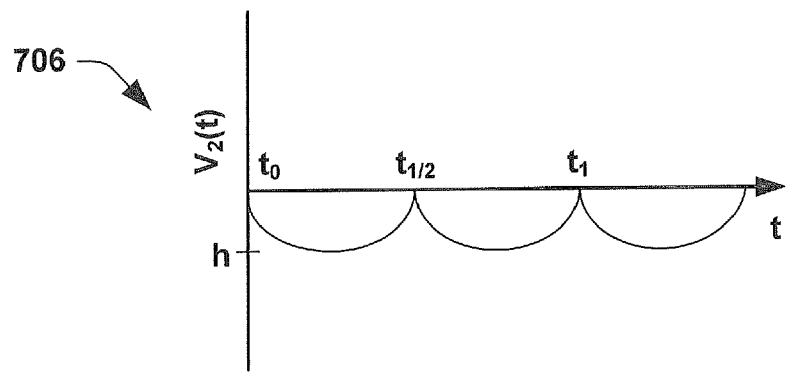
FIG. 7C is a voltage versus time graph illustrating a quadratic compensation waveform generated by a second wave generator as provided herein.

FIG. 7C is a voltage versus time graph illustrating a quadratic compensation waveform generated by a second wave generator, to compensate for variations in pressure along the ion beam line. The quadratic compensation waveform has a fixed height, h, and an amplitude that varies according to the quadratic waveform. As illustrated in FIG. 7C, the quadratic compensation waveform is of the form:

$$V_2(t) = at^*(t - t_{1/2})$$

wherein t is time, and $t_{1/2}$ is a half period of the original scan waveform (e.g., 500 microseconds for a 1 KHZ scan).

FIG. 8A illustrates the summation of the main scan waveform with the quadratic compensation waveform illustrated in FIGS. 7A and 7C. The addition of the quadratic compensation waveform to the main scan waveform results in a beam scanning waveform that has a different linear slope (dV/dt) than the main scan waveform. In other words, the quadratic compensation waveform 804 changes the slope of the main scan waveform 802 so that the beam scanning waveform 806 provided to the scanning system (e.g., to the scanning plates) comprises a compensation for any changes in the vacuum level.

For example, the linear slope of the main scan waveform 802 can be modified as the vacuum level in the along the beam line (e.g., in the process chamber) degrades, due to an increase in photoresist outgassing, to slow the scan speed of the ion beam on a first side of a workpiece (e.g., therefore increasing the density of implanted ions on the first side) and increase the scan speed of the ion beam on a second, opposite, side of the workpiece (e.g., therefore decreasing the density of implanted ions on the second side). Alternatively, the linear slope of the main scan waveform 802 can be modified as the vacuum improves, due to a decrease in photoresist outgassing, to equalize the implant density across the workpiece by using uniform scan speed of the ion beam.

FIG. 8B is a voltage versus time graph of the beam scanning waveform 808 illustrating the derivative of the summation of the main scan waveform 802 and quadratic compensation waveform 804. As can be seen in FIG. 8B, the slope of the beam scanning waveform 808 is no longer linear and therefore the ion beam will not proceed across the workpiece at a constant velocity. Instead, as illustrated in FIG. 8B the time derivative of the beam scanning waveform 808 is sloped. Therefore, from $t_0$ to $t_{1/2}$ the ion beam will move from right to left across the workpiece in a motion that begins slowly and then gradually speeds up across the workpiece (illustrated as the beam scanning waveform voltage increasing in time). Similarly, from time $t_{1/2}$ to $t_1$ the beam scanning waveform will cause the ion beam to move from the left to the right, across the workpiece, in a motion that begins quickly and then gradually slows down (illustrated as the scanning voltage decreasing in time).

Accordingly, as provided in the example shown in FIGS. 7A-8B, a quadratic compensation waveform has introduced a compensation to the main scan waveform that allows the resulting beam scanning waveform to account for the changes in pressure. As pressure within the processing chamber increase or decrease the amplitude of the quadratic compensation waveform may increase or decrease thereby resulting in a larger change in the scanning voltage (and a larger change in the velocity of the scanning ion beam).

Figure 9:
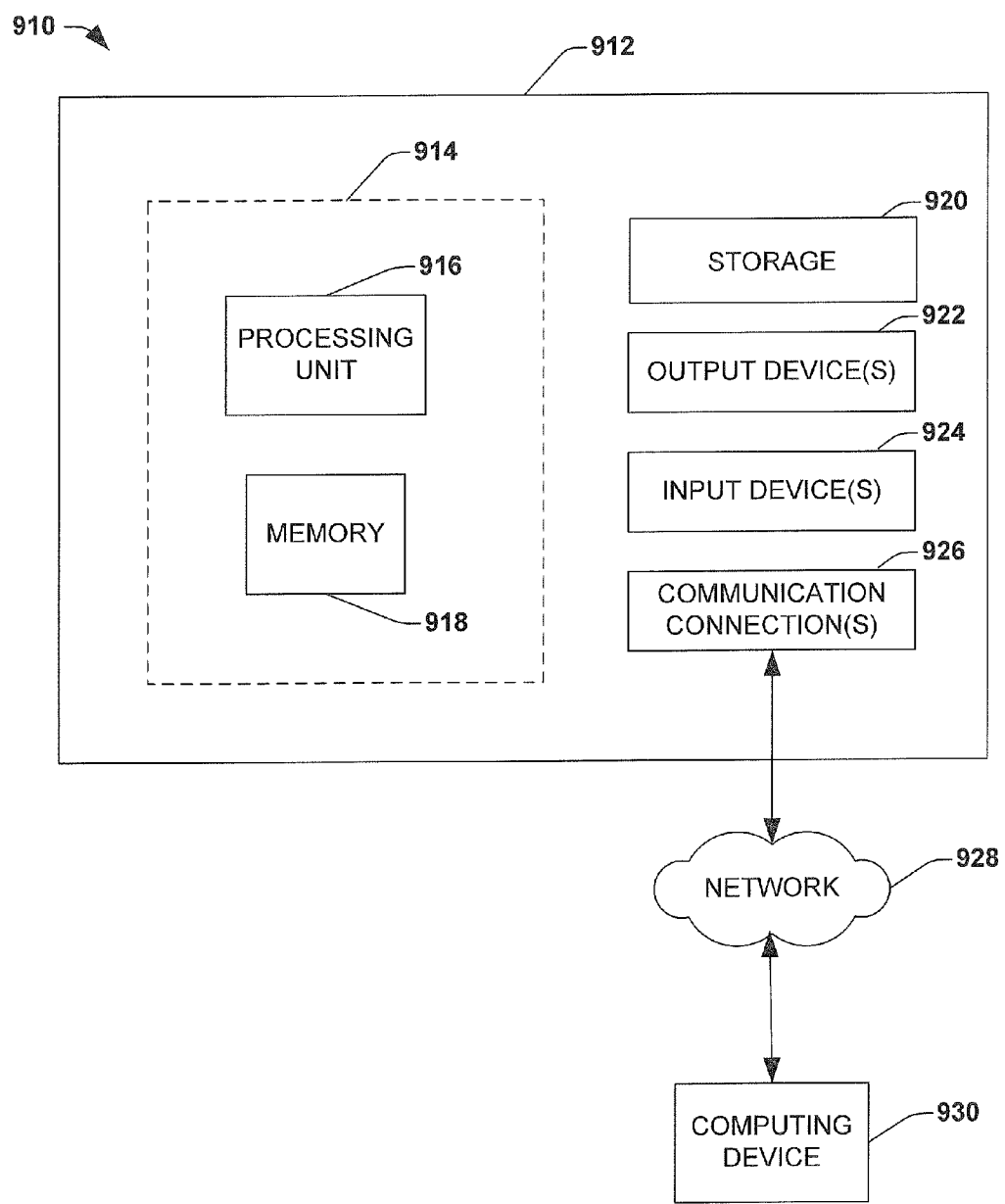
FIG. 9 illustrates an exemplary computing environment wherein one or more of the provisions set forth herein may be implemented.

FIG. 9 illustrates an alternative embodiment, wherein a computer system is configured to improve implant uniformity during photoresist outgassing. The computer system is configured to generate a main scan waveform and a compensation waveform. The main scan waveform and the compensation waveform are then added or mixed to create a beam scanning waveform that is provided to a beam scanning apparatus. It will be appreciated that the computer system performs these actions in software and therefore does not require physical wave generators.

As illustrated in FIG. 9 a system 910 comprises a computing device 912 configured to operate software (e.g., stored in memory or as computer readable instructions stored on one or more computer readable media medium) to generate a main scan waveform and a compensation waveform as provided in one or more embodiments provided herein. In one configuration, computing device 912 includes at least one processing unit 916 and memory 918. This configuration is illustrated in FIG. 9 by dashed line 914.

Device 912 may also comprise an input device 924 (e.g., keyboard, mouse, and/or any other input device), an output device 922 (e.g., one or more displays, speakers, printers, and/or any other output device), and a communication device 926 configured to communicate over a network 928 to other computing devices 930.

Although the invention has been described as a method to generate a compensation waveform to compensate for pressure changes due to outgassing it will be appreciated that the method and apparatus provided herein may be utilized in a wide range of applications.

Furthermore, although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system, comprising:
    a first wave generator configured to generate a main scan waveform having a substantially linear slope;
    a second wave generator configured to generate a compensation waveform; and
    an adder configured to provide a beam scanning waveform by adding the main scan waveform and the compensation waveform;
    wherein the compensation waveform is selected to have a waveform and an amplitude that are configured to modify the slope of the main scan waveform in a manner that accounts for non-uniformities of a dose of an ion beam along a fast scan direction.

2. The ion implantation system of claim 1, wherein the beam scanning waveform comprises a slope that causes the ion beam to gradually increase or decrease its speed as it moves across a workpiece.

3. The ion implantation system of claim 1, wherein the compensation waveform comprises a quadratic waveform.

4. The ion implantation system of claim 1, wherein the main scan waveform is substantially unaffected by pressure changes in the ion implantation system.

5. The ion implantation system of claim 1, further comprising an adjustment apparatus coupled to the second wave generator and configured to adjust the amplitude of the compensation waveform by a mixture ratio.

6. The ion implantation system of claim 5, wherein the adjustment apparatus comprises a variable compensation attenuator.

7. The ion implantation system of claim 5, wherein the mixture ratio is determined based upon measurements taken from a first edge faraday cup and a second edge faraday cup located at opposite sides of the ion beam.

8. The ion implantation system of claim 5, wherein the mixture ratio is determined based upon measurements taken from a pressure sensor located along a beam line.

9. The ion implantation system of claim 5, wherein the adjustment apparatus is configured to dynamically modify the amplitude of the compensation waveform based upon a pressure measured at an end station.

10. The ion implantation system of claim 1, wherein the waveform and the amplitude of the compensation waveform may be adjusted in response to substantially instantaneous pressure measurements received by the second wave generator.

11. A method for improving implant uniformity of an ion implantation system, comprising:
    generating a main scan waveform having a piecewise linear slope;
    generating a compensation waveform; and
    adding the compensation waveform to the main scan waveform to produce a beam scanning waveform that is utilized to direct an ion implantation beam;
    wherein the compensation waveform is selected to have a waveform and an amplitude that are configured to modify the slope of the main scan waveform in a manner that accounts for non-uniformities of a dose of an ion beam along a fast scan direction.

12. The method of claim 11, further comprising adjusting the amplitude of the compensation waveform to vary a mixture ratio between the main scan waveform and the compensation waveform.

13. The method of claim 12, wherein the compensation waveform comprises a quadratic waveform.

14. The method of claim 13, wherein the quadratic waveform is of a form of $V2(t)=at*(t-1_{1/2})$.

15. The method of claim 12, wherein the mixture ratio is determined based upon measurements taken from a first edge faraday cup located at an edge of the ion beam and a second edge faraday cup located at an opposite edge of the ion beam.

16. The method of claim 12, wherein the amplitude of the compensation waveform may be adjusted proportional to an amplitude of the main scan waveform so that a maximum mixture ratio of the compensation waveform stays constant irrespective of the amplitude of the main scan waveform.

17. The method of claim 12, wherein the mixture ratio is determined based upon measurements taken from a pressure sensor located along a beam line.

18. The method of claim 12, wherein the method is embodied on a computer readable medium.

19. The method of claim 11, wherein the beam scanning waveform comprises a slope that causes the ion beam to gradually increase or decrease its speed as it moves across a workpiece.

20. An ion implantation system, comprising:
 a first wave generator configured to generate a main scan waveform having a substantially piecewise linear slope that is configured to provide a substantially uniform ion beam scanning velocity over a workpiece;
 a second wave generator configured to generate a compensation waveform; and
 an adder configured to provide a beam scanning waveform to a beam scanning apparatus, wherein the beam scanning waveform is formed by adding the main scan waveform and the compensation waveform;
 wherein the compensation waveform is selected to have a waveform and an amplitude configured to modify the slope of the main scan waveform in response to substantially instantaneous pressure measurements received by the second wave generator;
 and wherein the beam scanning waveform comprises a non-linear slope that causes an ion beam to increase or decrease its speed as it moves across the workpiece.

* * * * *